US 11,249,529 B2

(12) United States Patent
Horvath

(10) Patent No.: US 11,249,529 B2
(45) Date of Patent: Feb. 15, 2022

(54) DETECTION OF REMOVABLE POWER INLET CURRENT RATING

(71) Applicant: Hewlett Packard Enterprise Development LP, Houston, TX (US)

(72) Inventor: Stephen Horvath, Roseville, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 192 days.

(21) Appl. No.: 16/289,351

(22) Filed: Feb. 28, 2019

(65) Prior Publication Data
US 2020/0278732 A1 Sep. 3, 2020

(51) Int. Cl.
*G06F 1/28* (2006.01)
*G06F 1/18* (2006.01)
*G01R 19/165* (2006.01)
*H04L 12/10* (2006.01)

(52) U.S. Cl.
CPC .......... *G06F 1/28* (2013.01); *G01R 19/16547* (2013.01); *G06F 1/18* (2013.01); *H04L 12/10* (2013.01)

(58) Field of Classification Search
CPC ..... G06F 1/32; G06F 1/12; G06F 1/28; G06F 1/26; G06F 9/44
See application file for complete search history.

(56) References Cited

U.S. PATENT DOCUMENTS

| 5,844,326 | A | * | 12/1998 | Proctor | ................. | H02H 3/033 |
| | | | | | | 307/34 |
| 6,731,507 | B2 | | 5/2004 | Varghese et al. | | |
| 7,155,622 | B2 | | 12/2006 | Mancey et al. | | |
| 7,382,624 | B2 | | 6/2008 | Barsun et al. | | |
| 8,093,748 | B2 | | 1/2012 | Martins | | |
| 9,825,518 | B2 | | 11/2017 | Shen et al. | | |
| 2002/0134567 | A1 | * | 9/2002 | Rasmussen | ............. | G06F 1/189 |
| | | | | | | 174/50 |
| 2011/0125341 | A1 | * | 5/2011 | Heath | ..................... | H04L 12/10 |
| | | | | | | 700/295 |
| 2011/0166719 | A1 | * | 7/2011 | Pasek | ........................ | G06F 1/26 |
| | | | | | | 700/291 |
| 2013/0227319 | A1 | * | 8/2013 | Ye | ............................. | G06F 1/20 |
| | | | | | | 713/320 |

OTHER PUBLICATIONS

Cisco, Configuration Note for Catalyst 2960 Switch Power over Ethernet Ports, Rel. 12.2(44)SE, Jan. 29, 2008, pp. 1-22, Retrieved from the Internet Aug. 17, 2018 at URL: <cisco.com/c/en/us/td/docs/switches/lan/catalyst2960/software/release/12-2_44_se/configuration/note/ol14988.html#wp1029097>.

* cited by examiner

Primary Examiner — Keshab R Pandey
(74) Attorney, Agent, or Firm — Hewlett Packard Enterprise Patent Department

(57) ABSTRACT

Examples described herein include a removable power inlet, a removable power supply, and an electrical connection between the removable power inlet and the removable power supply. The removable power inlet may send a signal to the removable power supply to indicate an ampere rating of the removable power inlet. The removable power supply may set a current limit on a power supplied from the removable power supply based on the signal.

19 Claims, 4 Drawing Sheets

DETECTION OF REMOVABLE POWER INLET CURRENT RATING

BACKGROUND

Computing devices such as networking devices, etc. may supply power to other computing devices. In some examples, the computing device supplying the power may include a removable power inlet and a removable power supply. The removable power inlet may connect directly to a main power source (e.g., through a wall outlet, etc.) and draw power from the main power source. The power is transferred to the removable power supply in the computing device, which then transfers the power to the other computing devices. Accordingly, the other computing devices do not need to connect directly to the main power source.

BRIEF DESCRIPTION OF THE DRAWINGS

The following detailed description references the drawings, wherein.

DETAILED DESCRIPTION

Figure 1:
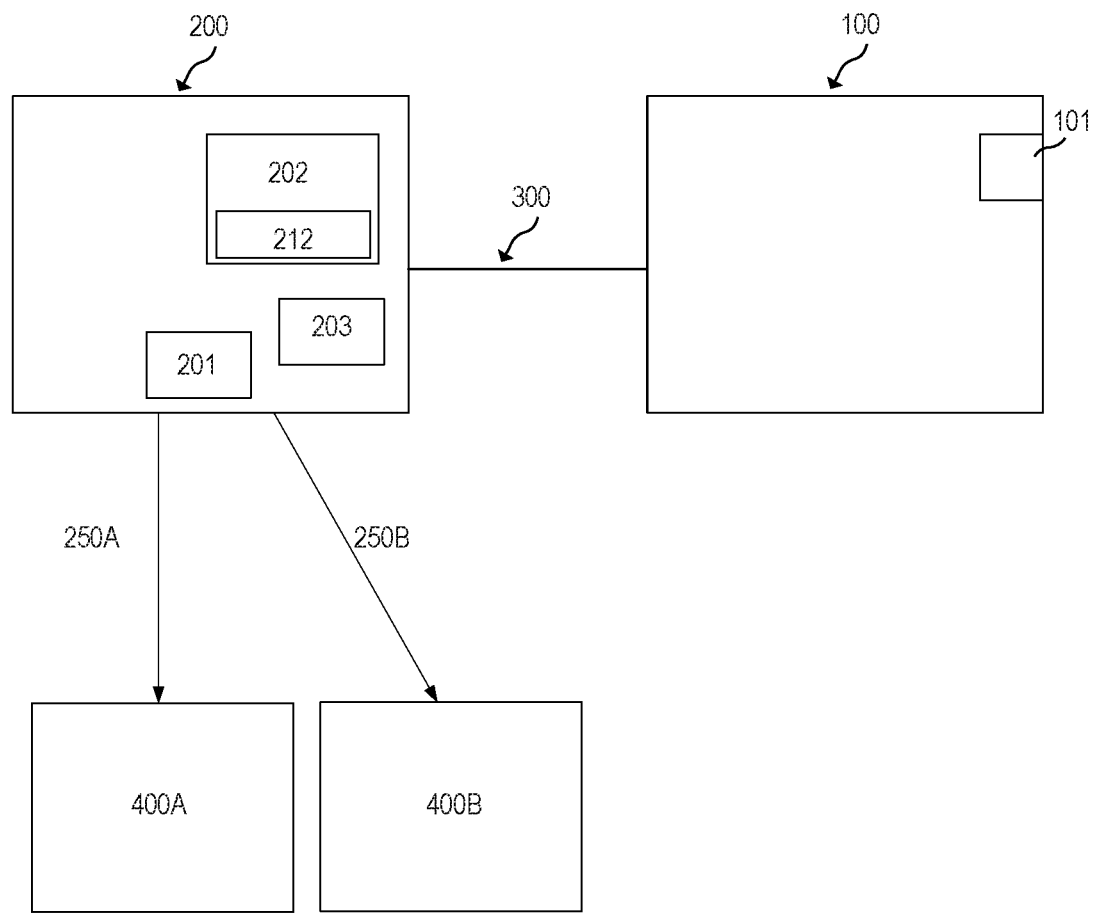
FIG. 1 illustrates an interaction between a removable power supply and a removable power inlet, according to some examples.

In some examples, the power required by a computing device that supplies power to other connected computing devices may vary in different situations. This is because some connected computing devices may require a higher power than other connected computing devices. For example, a networking device that is configured to provide power to connected computing devices using power over Ethernet (PoE) may require more power when it is connected at a first location in the network versus at a second location of the network due to the customers and applications running at the different locations.

To address these different power scenarios, in some examples, the removable power supply of a computing device may be removable such that another removable power supply may be used in the computing device. This allows the user to use a removable power supply with the appropriate power capability for the situation in which the computing device is used. A power cord that is used to connect the computing device to the main power source may be regulated by government authorities or safety boards such that the power cord is limited in the maximum amount of current it can draw. For example, one power cord may be rated such that it can carry 15 amps while another power cord is rated to carry 20 amps. A power cord used with the computing device should be rated to handle at least the current that is drawn by the removable power supply. Because the power cord connects to the removable power inlet of the computing device, this in turn drives the removable power inlet that is used by the computing device as well. In other words, the removable power inlet should also be rated to handle at least the current that is drawn by the removable power supply. This may be characterized as the removable power inlet being compatible with the removable power supply. This helps to ensure that the computing device is operating safely when drawing power from the main power source. In some examples, to ensure that the computing device has a removable power inlet that is compatible with the removable power supply, the removable power inlet and the removable power supply are physically implemented together such that the removable power inlet and the removable power supply are moved as one single unit. In these examples, the removable power supply and the removable power inlet may be physically integrated (e.g. formed integrally) and cannot be separated. These approaches limit the flexibility of the computing device to accommodate different physical orientations of the infrastructure setup. For example, a power cord may plug in easily from the back of a computing device but a removable power supply may be more easily removed for easy access in removal and replacement. Accordingly, this requires that the removable power inlet be accessible from the back of the computing device and the removable power supply be accessible from the front. Power supplies and removable power inlets that are physically implemented together will not allow this configuration because they can only be installed together at either the front or the back of the computing device. In other examples, to ensure that the computing device has a removable power inlet that is compatible with the removable power supply, the user may implement the highest possible rated AC removable power inlet. However, this drives up the power cord rating and may force the customer to have the highest possible power infrastructure (e.g., mains infrastructure), wiring, breaker, etc. capacity. Examples disclosed herein address these technical challenges by providing computing device with a removable power inlet and a removable power supply. The removable power inlet and the removable power supply are separately removable from the computing device and thus are not physically implemented together as one unit. In some examples, the removable power inlet may send a signal to the removable power supply that indicates its current rating. Based on the signal, the removable power supply may limit a maximum current that it may draw such that the current is the same or less than the current rating of the removable power inlet. This allows a user to both configure the computing device based on removable power supply needs without being limited to a single orientation of the computing device. Accordingly, a user may use a removable power inlet and/or supply that matches the power that is needed instead of opting for a higher current rating or using a less than ideal orientation.

Referring now to the figures, FIG. 1 illustrates a removable power inlet 100 and a removable power supply 200. The removable power inlet 100 is removable in relation to a computing device (not shown in FIG. 1) into which the removable power inlet 100 is inserted. The removable power supply 200 is also removable in relation to the same computing device. Additionally, removable power supply 200 is removable separately from removable power inlet 100 and vice versa. Thus, removable power supply 200 may be removed from the computing device while removable power inlet 100 remains and removable power inlet 100 may be removed from the computing device while removable power supply 200 remains.

Removable power inlet 100 may be a self-contained unit that allows a computing device to connect to draw power from an electrical system of a main power source, such as a mains electricity infrastructure, a solar cell system, etc. The removable power inlet 100 may allow the computing device to draw power from that bigger power source such that computing device may use that power for its own usage and/or distribute that power to other computing devices that are connected to it. As used herein, a "computing device" may include a server, a networking device, a chipset, a desktop computer, a workstation, a mobile phone, a tablet, an electronic reader, or any other processing device or equipment.

Removable power inlet 100 may comprise a power receptacle 101. Power receptacle 101 may allow removable power inlet 100 to electrically connect to a power cord (not shown in FIG. 1) that is connected to the main power source. In some examples, power receptacle 101 may form a complementary fit with one end of a power cord. For example, power receptacle 101 may comprise a male end of an electrical connector that fits into a female end of the power cord. In some examples, power receptacle 101 may follow shapes and/or sizes set by committees such as the International Electrotechnical Commission (IEC) (e.g., IEC 60320 C19/C20 coupler)), National Electrical Manufacturers Association (NEMA), etc. In some examples, power receptacle 101 may depend on the type of computing device removable power inlet 100 is used in and the electricity requirements of that computing device. For example, in situations where computing device will utilize and/or distribute electricity at higher currents (e.g., 20 amperes), receptacle 101 may be different than in situations where computing device will utilize and/or distribute electricity at lower currents (e.g., 15 amperes). Removable power inlet 100 may also include internal circuitry, for example a printed circuit board (PCB) and/or wiring, that passes the electrical connection from a power cord connected to the power receptacle through removable power inlet 100 to electrical connection 300. Removable power inlet 100 may also include other components found in power inlets such as electrical components and/or filtering to mitigate electromagnetic interference (EMI), and safety protection such as fuses used for breaking the current. The components of removable power inlet 100 may be held inside a physical container such as a chassis with electrical connections that allow the internal circuitry of removable power inlet 100 to mate with electrical connections of a computing device that it is attached to.

Removable power supply 200 may be a self-contained unit that allows a computing device to take the power drawn from removable power inlet 100 and distribute that power to connected computing devices 400A and 400B. In FIG. 1, the distribution of the power is represented by lines 250A and 250B. In some examples, removable power supply 200 may convert the type of current drawn by removable power inlet 100. For example, removable power inlet 100 may draw from an AC current supply (e.g., a mains removable power supply). Removable power supply 200 may convert the AC current to a D/C current that may then be distributed to computing devices 400A and 400B. Removable power supply 200 may also convert the AC current to be used directly by the computing device.

Because both removable power supply 200 and removable power inlet 100 are removable, it is important that they are compatible with each other. For example, a removable power inlet that is rated for a current of 15 amps that is paired with a removable power supply rated for a current of 20 amps may cause overload and unsafe conditions for the removable power supply. This may also lead to reliability issues when it comes to power distribution 250A and 250B. In this situation, the removable power inlet and the removable power supply are not compatible with each other.

Accordingly, removable power supply 200 may limit the amount of current it supplies based on a signal sent by removable power inlet 100. An electrical connection 300 allows removable power inlet 100 to send an electrical signal to the removable power supply 200 that indicates an ampere rating of the removable power inlet 100. As used herein, an ampere rating indicates the maximum amount of current that removable power inlet 100 may safely draw without exceeding its ratings. For example, the rating may be based on an operating temperature that the components of the power inlet may handle.

In some examples, the signal capability may be binary. In examples where it is binary, the signal may be set at high or low (e.g., in terms of voltage). For example, a high signal may be given a threshold of X voltage. When the signal is at X voltage or higher, the signal is high. When the signal is below X voltage, the signal is low. The two different signals may indicate different ampere ratings of the removable power inlet 100. For example, the removable power inlet 100 may have an ampere rating of 15 amps. A low signal is sent via electrical connection 300. Accordingly, the removable power supply may use this signal and limit its current rating at 15 amps. As another example, the removable power inlet 100 may have an ampere rating of 20 amps. A high signal is sent via electrical connection 300 to removable power supply 200. Based on this high signal, the removable power supply may limit its current rating at 20 amps (and not 15 amps).

In some examples, the signal of the removable power inlet 100 that indicates the ampere rating may be pre-set based on the ampere rating. For example, in situations where the removable power inlet has a lower ampere rating (e.g., 15 amps versus 20 amps), the signal may be tied to earth. This signal runs through electrical connection 300 and is received by internal circuits in removable power supply 200 that may process the signal. For example, the internal circuits of removable power supply 200 may comprise a resistor that receives this signal. The resistor is sourced to a DC voltage inside removable power supply 200. In situations where the removable power inlet 100 has a low ampere rating, the voltage is not changed and stays at zero. In situations where the removable power inlet has a higher ampere rating (E.g., 16 amps versus 15 amps), the signal may be left open. In this situation, the DC sources current through the resistor and the signal is pulled up to a higher voltage by the interaction with the resistor in removable power supply 200. In some examples, this type of resistor is called a pull up resistor.

In other examples, the signal is not pre-set in removable power inlet 100 but is set by a digital logic device (e.g., FPGA, etc.) that may set the signal to drive the signal high or low.

In other examples, the signal may be capable of indicating more than two states of the removable power inlet 100-. For example, a third state may be indicated. The third state can be used to indicate other ampere ratings and/or current types of removable power inlet 100. For example, the removable power inlet 100 may be a DC removable power inlet and the removable power supply 200 may convert AC current into DC current. Accordingly, the removable power supply 200 may not use the current that is being drawn from the removable power inlet 100. The signal sent by the removable power inlet 100 may indicate that it is a DC current. This may be represented by the additional states that the signal is capable of sending. Based on this type of signal, removable power supply 200 may not power on because the signal indicates that the type of current being drawn by removable power inlet 100 is incompatible and would not work with the removable power supply 200. In these examples, removable power inlet 100 may send multiple binary signals to indicate additional states. For example, there may be 8 binary signals (to indicate 256 states). In these examples, removable power inlet 100 may also use a communication bus to indicate more than two states and/or types of removable power inlets. For example, the signal sent by removable power inlet may indicate whether it has a 15 ampere rating, a 16 ampere rating, a 20 ampere rating, etc.

Accordingly, based on the signal from removable power inlet 100, removable power supply 200 may change its behavior. For example, it may limit the amount of current it distributes (e.g., 250A, 250B) so that the current matches the ampere rating of removable power inlet 100. Additionally, removable power supply 200 may not turn on because of a mismatch between the type of current removable power supply 200 intakes and the type of current drawn by removable power inlet 100.

In some examples, removable power supply 200 comprises a machine-readable storage medium 202 and a processing resource 203. Machine readable storage medium 202 may be in the form of non-transitory machine-readable storage medium, such as suitable electronic, magnetic, optical, or other physical storage apparatus to contain or store information such as instructions 212, related data, and the like.

As used herein, "machine-readable storage medium" may include a storage drive (e.g., a hard drive), flash memory, Random Access Memory (RAM), content-addressable memory (CAM), any type of storage disc (e.g., a Compact Disc Read Only Memory (CD-ROM), any other type of compact disc, a DVD, etc.) and the like, or a combination thereof. In some examples, storage medium 110 may include different types of memory for different types of information. In some examples, a storage medium may correspond to memory including a main memory, such as a Random Access Memory, where software may reside during runtime, and a secondary memory. The secondary memory can, for example, include a non-volatile memory where a copy of software or other data is stored.

In the example of FIG. 1, instructions 212 are stored (encoded) on storage medium 202 and are executable by processing resource 203 to implement functionalities described herein in relation to FIG. 1. In some examples, storage medium 202 may include additional instructions. In other examples, the functionalities of any of the instructions of storage medium 202 may be implemented in the form of electronic circuitry, in the form of executable instructions encoded on machine-readable storage medium, or a combination thereof.

Processing resource 203 may, for example, be in the form of a central processing (CPU), a semiconductor-based microprocessor, a digital signal processor (DSP) such as a digital image processing, other hardware devices or processing elements suitable to retrieve and execute instructions stored in a storage medium, or suitable combinations thereof. The processing resource can, for example, include single or multiple cores on a chip, multiple cores across multiple chips, multiple cores across multiple devices, or suitable combinations thereof. The processing resource can be functional to fetch, decode, and execute instructions 212 as described herein.

Instructions 212 may be executable by processing resource 203 to receive the signal sent from removable power inlet 100 and to limit the current supplied by removable power supply 200 based on the signal, as discussed above. For example, instructions 212 may change a digital setting that it stores and internal circuitry 200 of removable power supply may read this setting and actuate the limiting current.

Figure 2:
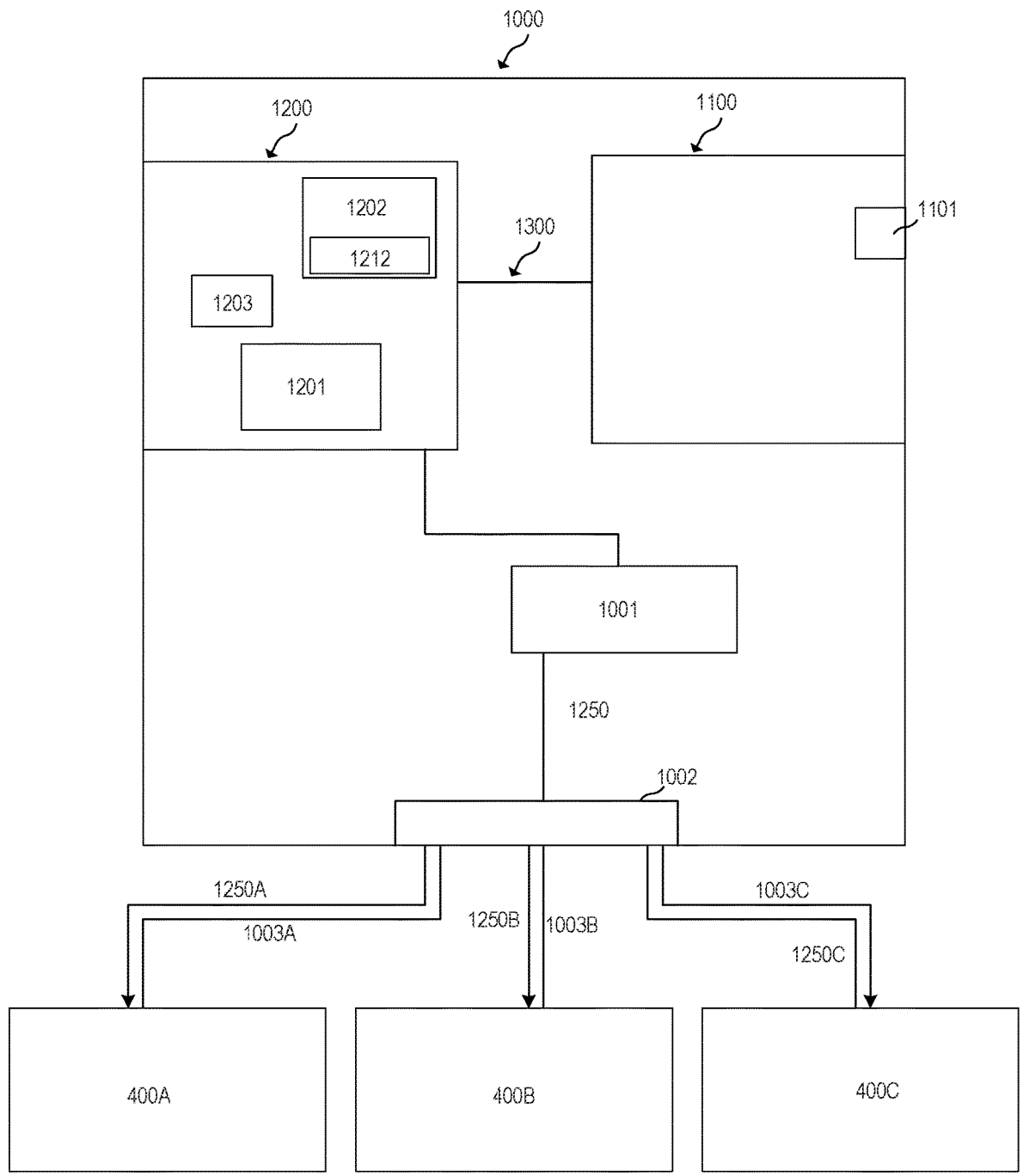
FIG. 2 illustrates a networking device comprising a removable power supply and a removable power inlet, according to some examples.

While removable power supply 200 is described in FIG. 2 has comprising processing resource 203, machine readable storage medium 202, and instructions 212 for receiving the signal and limiting the current supplied, in other examples, this may be accomplished by an analog circuit. For example, the internal circuitry of removable power supply 200 may comprise a passive analog circuit that receives the signal from electrical connection 300 and that signal may serve as an input to circuitry that turns on or off circuitry that limits or removes the current limit for removable power supply 200.

In some examples, removable power supply 200 may comprise an over current protection circuit 201. Over current protection circuits, as understood by one of ordinary skill in the art, may limit the maximum threshold of electrical current the removable power supply is allowed to source. When the current reaches the threshold, the over current protection circuit may shut down the removable power supply 200 (e.g., by opening a circuit in the removable power supply 200, etc.) For example, an over current protection with a specific current rating may limit the maximum amount of current sourced by the removable power supply to the specific current rating. Many over current protection circuits are fixed at a specific current rating. With the benefit of this disclosure, over current protection circuit disclosed herein may vary the maximum current sourced depending on the removable power inlet 100. In some examples, the maximum current threshold set by the over current protection circuit 201 is higher than the current rating of the removable power inlet 100. For example, in situations where the removable power inlet 100 indicates that it has an ampere rating of 15 amps, the maximum current threshold set by the over current protection circuit 201 may be 20 amps.

In some examples, over current protection circuit 201 may comprise circuitry that monitors the amount of current that is actively being drawn from removable power supply unit. In some examples, this monitoring may be continuous. The circuitry may also compare the amount of current being drawn to the maximum threshold that is set by removable power supply 200. This threshold is based on the signal that is received by removable power supply 200 from removable power inlet 100. In some examples, the signal may be stored by instructions 212 in machine readable memory 202 and instructions 212 may adjust the threshold based on the signal. For example, the threshold may be adjusted to a lower threshold based on a lower ampere rating. Conversely, the threshold may be adjusted to a higher threshold based on a higher ampere rating. The circuitry may read this threshold.

Electrical connection 300 may connect removable power inlet 100 to removable power supply 200. Accordingly, the signal from removable power inlet 100 may travel via electrical connection 300. In some examples, electrical connection 300 may comprise a number of conductors to carry a number of signals, one of the signals being the indication of ampere rating of the removable power inlet 100. In some examples, electrical connection 300 may comprise four conductors, as described in FIG. 3.

FIG. 2 illustrates a computing device 1000 with a removable power inlet 1100 and a removable power supply 1200. Electrical connection 1300 connects removable power inlet 1100 and removable power supply 1200. In some examples, computing device 1000 may comprise a networking device, such as a switch, router, etc. Removable power inlet 1100 is removable from computing device 1000 such that it may be swapped for another removable power inlet (not shown). In other words, a different removable power inlet may be attached to computing device 1000. The other removable power inlet may have a different ampere rating (e.g., higher ampere rating, lower ampere rating) than removable power inlet 1100. Additionally, the other removable power inlet may draw a different type of current than removable power inlet 1100. Removable power supply 1200 is removable from computing device 1000 such that it may be swapped for another removable power supply (not shown). In other words, a different removable power supply may be attached to computing device 1000. The other removable power supply may be different from removable power supply 1200 (e.g., in terms of the maximum current rating or power rating, or the type of current, etc.)

Removable power inlet 1100 is similar to removable power inlet 100 and the description provided for removable power inlet 100 applies to removable power inlet 1100.

Removable power inlet 1100 may slide in and out of a matching slot in computing device 1000 and be attached to computing device 1000 in a manner that allows removable power inlet to be non-permanently attached to computing device 1000. For example, a latching mechanism may allow removable power inlet 1100 to be attached to computing device 1000 and removed from computing device 1000. Additionally, a securing mechanism may be used to reinforce the latching mechanism. Such securing mechanisms may include screws, etc. Other attachment mechanisms known in the art may also be used to attach the removable power inlet 100 to computing device 1000. Additionally, removable power inlet 1100 may comprise electrical contacts that mates with electrical contacts in the matching slot in computing device 1000. These electrical contacts may mate in a male/female manner and make an electrical connection between removable power inlet 1100 and computing device 1000.

Removable power supply 1200 may be attached to computing device 1000. Removable power supply 1200 may slide in and out of a matching slot in computing device 1000. A latching mechanism may keep removable power supply 1200 in place. Additionally, removable power supply 1200 may comprise electrical contacts that mates with electrical contacts in the matching slot in computing device 1000. These electrical contacts may mate in a male/female manner and make an electrical connection between removable power supply 1200 and computing device 1000.

Computing device 1000 may have openings in its chassis that are sized and shaped to receive removable power supply 1200 and removable power inlet 1100.

As discussed above, computing device 1000 may include an electrical connection 1300 between removable power inlet 1100 and removable power supply 1200. Electrical connection 1300 may be comprised of multiple conductors that allow the current drawn from removable power inlet 1100 to be delivered to removable power supply 1200. Additionally, one of the multiple conductors may be a conductor that carries a signal to indicate the ampere rating of removable power inlet 1100. As discussed above, based on this signal, removable power supply 1200 may limit the amount of current sourced from removable power supply 1200 to computing devices 400A, 400B, and 400C. This protects the removable power inlet 1100 from being overloaded. Additionally, based on this signal, over current protection circuit 1201 may set a maximum current threshold. This may provide computing device 1000 with a secondary protection mechanism from current overload.

Due to the ability of removable power inlet 1100 and removable power supply 1200 to be removed from computing device 1000, a user of computing device 1000 may use an appropriate removable power inlet 1100 and/or an appropriate removable power supply 1200 depending on the power that computing device 1000 will need to supply to computing devices 400A, 400B, and 400C. Additionally, due to the signaling of the removable power inlet 1100 to the removable power supply 1200 and the ability of the removable power supply 1200 to dynamically change its current settings based on this signaling, computing device 1000 is protected from overload conditions that may occur from accidental mismatch of a removable power inlet and a removable power supply. For example, in situations where the removable power inlet has an ampere rating of 15 amps and the removable power supply has a capacity of 20 amps, there may be a potential for overload conditions in computing device 1000. Without any limitations on removable power supply, the removable power supply may source 20 amps, causing an overload on removable power inlet. With the benefit of this disclosure, users are able to dynamically change the removable power supply and/or the removable power inlet with reduced potential of unsafe conditions occurring from overload.

Additionally, removable power inlet 1100 and removable power supply 1200 are removable from computing device 1000 independent of each other. Accordingly, they may be placed in different locations in computing device 1000. For example, in the example illustrated in FIG. 2, removable power inlet 1100 may be removably attached to computing device 1000 at one side (e.g., a back side) of computing device 1000 and removable power supply 1200 may be removable attached to computing device 1000 at another side (e.g., a front side) of computing device 1000. Accordingly, power receptacle 1101 may allow a power cord (not shown) to connect to computing device 1000 at the back of computing device 1000 while removable power supply 1200 may be located at the front of computing device 1000 for easy access of the removable power supply 1200. Accordingly, removable power inlet 1100 and removable power supply 1200 do not have to be installed together (e.g., at the same time) as a unit. Additionally, removable power inlet 1100 and removable power supply 1200 do not have to be attached at the same side. This allows the user of computing device 1000 flexibility in both the orientation of the removable power supply and/or removable power inlet and the current capacity of the removable power supply and/or removable power inlet at the same time.

In some examples, computing device 1000 may include a power control unit 1001. Power control unit 1001 may comprise a computer readable storage medium (not shown) and a processing resource (not shown). The computer readable storage medium may store instructions that allow power control unit 1001 to determine the appropriate power to distribute to connected computing devices 400A, 400B, 400C. For example, the instructions may be executable by the processing resource to receive inputs from each connected computing device 400A, 400B, 400C to indicate how much power each device needs. The instructions may also be executable by the processing resource to read from removable power supply 1200 how much the removable power supply 1200 can supply. As discussed above, this amount may be dictated by the removable power inlet 1100. In some examples, this may be provided in a register of removable power supply 1200. Power control unit 1001 may distribute the power to connected computing devices 400A, 400B, 400C. Instructions on power control unit 1001 may also be executable to not grant any additional power to connected computing devices once the limit of removable power supply 1200 is reached. For example, if removable power supply 1200 has a limit of 3000 watts, power control unit 1001 may not grant any additional power to connected computing devices 400A, 400B, 400C beyond 3000 watts.

In some examples, computing device 1000 is a networking device (e.g., a switch) that is connected to other computing devices 400A, 400B, 400C via Ethernet connections 1003A, 1003B, and 1003C. Additionally, computing device 1000 may provide power to computing devices 400A, 400B, 400C using power over Ethernet. The power provided is indicated in FIG. 2 by arrows 1250A, 1250B, and 1250C. The power sourced from removable power supply 1200 is indicated by line 1250. Accordingly, computing device 1000 may have an area of Ethernet ports 202 allowing for Ethernet compatible electrical cords to connect to computing device 1000. Other computing devices 400A, 400B, 400C may include phones (e.g. VOIP phones), cameras, wireless access points, etc.

Figures 3, 4:
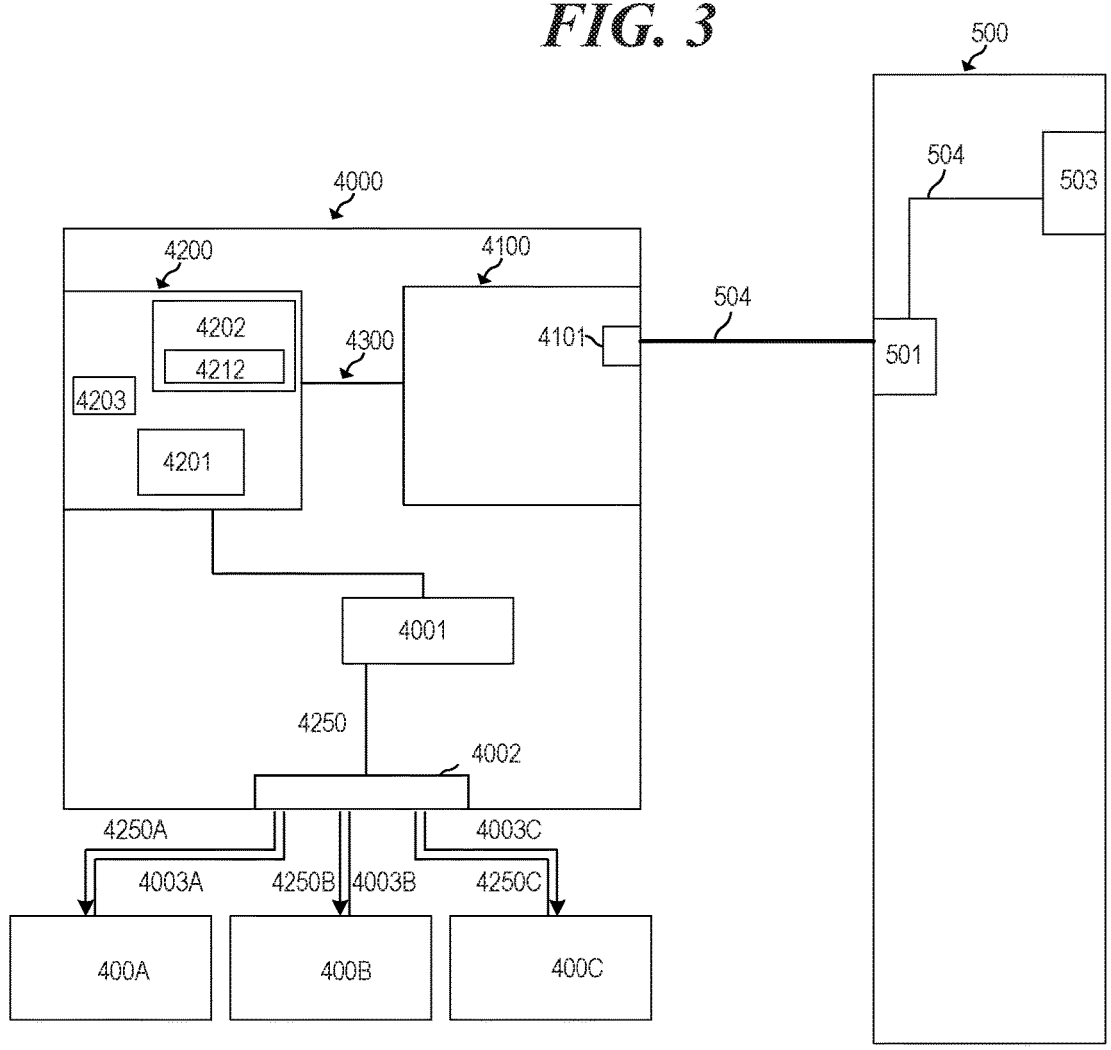
FIG. 3 illustrates an electric connector may connect a removable power supply and a removable power inlet, according to some examples.
FIG. 4 illustrates a computing device comprising a removable power supply and a removable power inlet interacting with a building mains wiring infrastructure, according to some examples.

FIG. 3 illustrates a conceptual view of an electrical connection 1300 between removable power inlet 1100 and removable power supply 1200. In FIG. 3, electrical connection 1300 comprises four conductors 1301, 1302, 1303, and 1304. Conductors 1301, 1302, and 1303 may be used to transfer the power between removable power inlet 1100 and removable power supply 1200. For example, conductor 1301 may be a hot wire, which is used to transfer an AC current, conductor 1302 may be a neutral wire which provides the return path for the current provided by the conductor 1301, and conductor 1303 may be a ground wire which provides a safety feature to eliminate shock hazard in event of a short circuit. Conductor 1304 may be a wire provides the signal indicating the ampere rating of removable power inlet 1100. In some examples, each conductor may be sheathed by plastic. In some examples, conductor 1304 may be incorporated into a printed circuit board (PCB).

FIG. 4 illustrates a computing device 4000 that is connected to power supply infrastructure 500 (e.g., a mains electricity infrastructure). Computing device 4000 may then provide the power drawn from power supply infrastructure 500 to connected computing devices 400A, 400B, and 400C.

Power supply infrastructure 500 may be connected by a power grid into a power generator (e.g., a power plant). Power supply infrastructure 500 (e.g., a mains infrastructure) may comprise a circuit breaker 503, an outlet 501, and wiring 502 to connect the circuit breaker and outlet 501. Outlet 501 allows for a cable 504 to connect to outlet 501 via a male/female interaction between the outlet 501 and cable 504. In some examples, the end of cable 504 that connects to outlet may be a plug and the outlet may be a socket where the plug and socket interacts in via a male/female connection.

The other end of cable 504 may connect to a power receptacle 4101 of computing device 4000. Power receptacle 4101 is similar to power receptacle 1101 and the discussion of power receptacle 1101 is applicable here. Computing device 4000 also comprises a removable power inlet 4100, removable power supply 4200, an electrical connection 4300, a power control unit 4001, and ports 4002. Removable power inlet 4100 is similar to removable power inlet 1100, removable power supply 4200 is similar to removable power supply 1200, electrical connection 4300 is similar to electrical connection 1300, power control unit 4001 is similar to power control unit 1001, and ports 4002 are similar to ports 1002.

In the example of FIG. 4, power supply infrastructure 500 provides an AC current from a main AC power source. That current is drawn from power supply infrastructure 500 to removable power inlet 4100 of computing device 4000 via power cable 504. In some examples, power supply infrastructure 500 may be designed such that it is sufficient to meet power requirements of the enterprise using computing device 4000. This is because removable power inlet 4100 is removable from computing device 4000. Accordingly, because removable power inlet 4100 may be chosen based on power needs, power supply infrastructure 500 does not need to be driven to meet a capacity (e.g., ampere rating) that is higher than needed. This may result in reduced costs in terms of building wiring, outlets, breakers, etc.

Removable power inlet 4100 takes the AC current and provides it to removable power supply 4200 via electrical connection 4300. As discussed above, removable power inlet 4100 may have an ampere rating. This ampere rating may be the legal amount of current that removable power inlet 4100 is supposed to draw from power supply infrastructure 500. Removable power inlet 4100 may be chosen by a user of computing device 4000 for the ampere rating. For example, in situations where connected computing devices 400A, 400B, and 400C require a small amount of power, a user of computing device 4000 may choose a removable power inlet 4100 with relatively smaller current rating (e.g., a 10 ampere rating versus a 20 ampere rating). In other situations where connected computing devices 400A, 400B, and 400C require more power, a user of computing device 4000 may choose a removable power inlet 4100 with a relatively bigger current rating (e.g., a 20 ampere rating versus a 15 ampere rating). After attachment to computing device 4000, removable power inlet 4100 may send a signal over electrical connection 4300 to indicate its ampere rating to removable power supply 4200.

Based on this signal, removable power supply 4200 may limit the amount of current it can draw from removable power inlet 4100. Accordingly, in situations where removable power inlet 4100 has a current ampere rating of 10 amperes, removable power supply 4200 may limit the amount of current it can draw from removable power inlet 4100 at 10 amps even though removable power supply 4200 may have the capability to handle higher currents. In situations where removable power inlet 4200 has a higher current rating (e.g., 15 amperes or 20 amperes, etc.), removable power supply 4200 may limit the current it can draw from removable power inlet 4100 to that higher current rating. Accordingly, as described above, removable power supply 4200's current is dynamic and variable upon the signal that it receives from removable power inlet 4100. In some examples, and as described above, this may be accomplished via computer readable storage medium 4202, processing resource 4203, and instructions 4212. Specifically, instructions 4212 may be stored on computer storage medium 4202 and may be executable by processing resource 4203 to allow removable power supply 4200 to receive the signal sent by removable power inlet 4100 and, based on that signal, make changes to limit the current it draws.

Removable power supply 4200 may take the AC current drawn from removable power inlet 4100 and convert it to DC current such that it is in a form that is usable by connected computing devices 400A, 400B, and 400C.

Removable power supply 4200 may also comprise an over current protection circuit 4201. Over current protection circuit 4201 is similar to over current protection circuit 201 and the description for over current protection circuit 201 is applicable to over current protection circuit 4201.

Computing device 4000 may comprise a power control unit 4001 that may help to manage the power distribution of computing device 4000 to connected computing devices 400A, 400B, and 400C. For example, computing device 4000 may read a register in removable power supply 4200 which indicates how much power removable power supply 4200 has available. Based on that, power control unit 4001 may keep track of how much power connected computing devices 400A, 400B, 400C are requesting and distribute the power accordingly via ports 4002. Power control unit 4001 is similar to power control unit 1001 and the description of power control unit 1001 is applicable here.

Computing device 4000 and connected computing devices 400A, 400B, 400C may be power over Ethernet devices. Accordingly, the connection between computing device 4000 and connected computing devices 400A, 400B, and 400C may be via an Ethernet connection. The power can be supplied from computing device 4000 to connected computing devices 400A, 400B, and 400C via the Ethernet connection.

Figure 5:
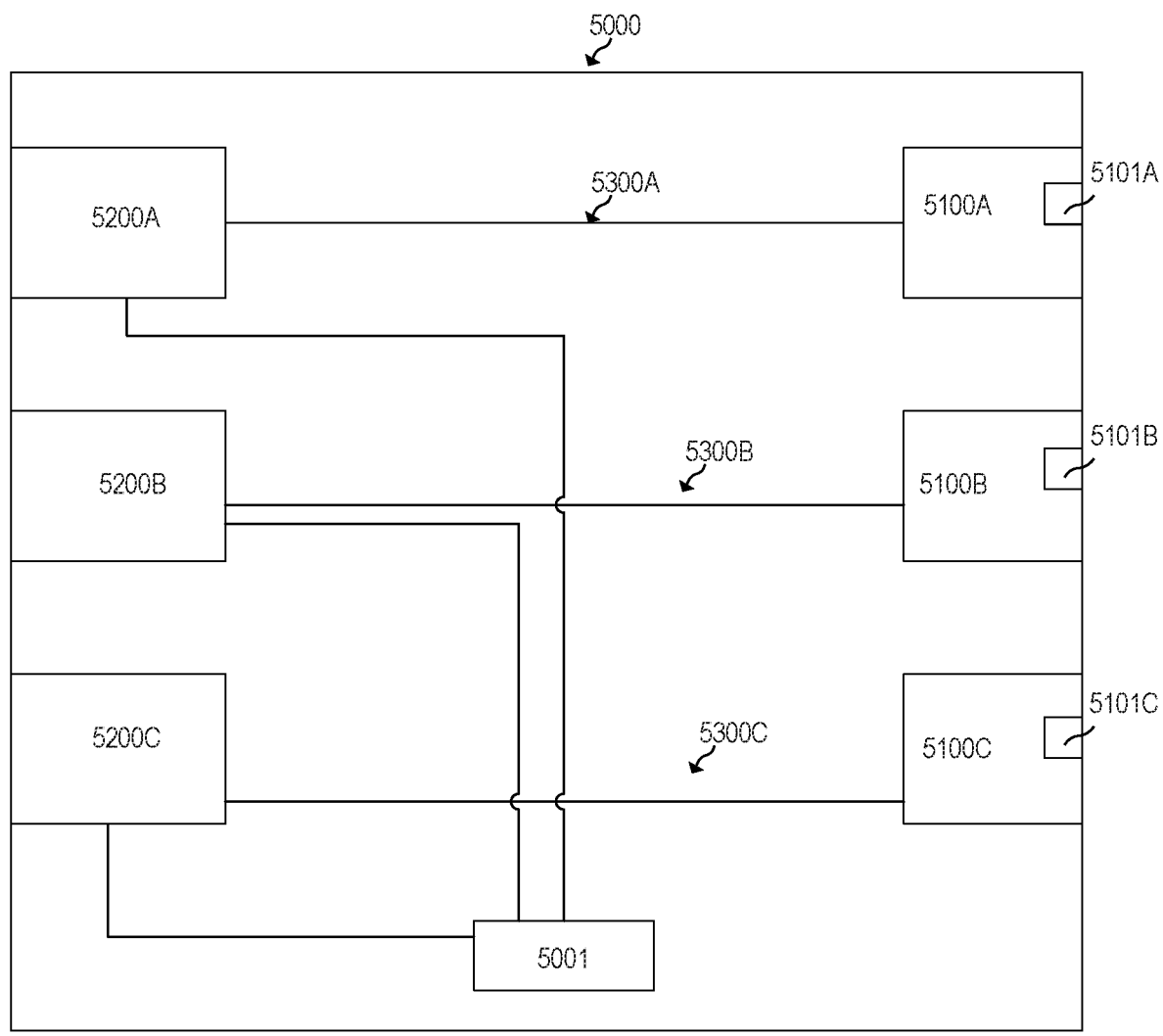
FIG. 5 illustrates a computing device with multiple removable power supply and multiple removable power inlets, according to some examples.

FIG. 5 illustrates a computing device 5000 with multiple removable power inlets 5100A, 5100B, 5100C, and multiple power supplies 5200A, 5200B, 5200C. Each removable power inlet 5100A, 5100B, and 5100C is removable from computing device 5000 such that each one is interchangeable with a different removable power inlet (e.g., a removable power inlet with a different ampere rating). Each removable power supply is removable from computing device 5000 such that each one is interchangeable with a different removable power supply (e.g., a removable power supply with a different ampere capacity, power capacity, etc.). Each removable power inlet 5100A, 5100B, 5100C is similar to removable power inlet 100 and the description of removable power inlet 100 is applicable here. Each removable power supply 5200A, 5200B, 5200C is similar to removable power supply 200 and the description of removable power supply 200 is applicable here.

Removable power inlet 5100A is connected to removable power supply 5200A via electrical connection 5300A. Removable power inlet 5100B is connected to removable power supply 5200B via electrical connection 5300B. Removable power inlet 5100C is connected to removable power supply 5200C via electrical connection 5300C. Accordingly, removable power inlet 5100A may send a signal to removable power supply 5200A to indicate its ampere rating and removable power supply 5200A may limit its current based on the signal it receives. Removable power inlet 5100B may similarly send a signal to removable power supply 5200B to indicate its ampere rating and removable power supply 5200B may limit its current based on the signal it receives. Removable power inlet 5100C may similarly send a signal to removable power supply 5200C to indicate its ampere rating and removable power supply 5200C may limit its current based on the signal it receives. Accordingly, each removable power supply 5200A, 5200B, and 5200C is matched to its respective removable power inlet 5100A, 5100B, and 5100C so that removable power inlets 5100A, 5100B, and 5100C are not drawing current at unsafe or illegal amounts. Thus, computing device 5000 may support removable power inlets with different current ratings and power supplies with different power ratings, without physically restricting the removable power supply and the removable power inlet to each other.

While the examples described in FIG. 1, FIG. 2, FIG. 3, FIG. 4, and FIG. 5 specifically describe limiting the current of a removable power supply based on the signal received from a removable power inlet, other responses of the removable power supply are included in the description (e.g., powering off, etc.). For example, a removable power supply may, based on the signal received by the removable power inlet, determine that the removable power inlet is drawing a current type that is not usable with itself (e.g., where the removable power inlet is drawing a DC current and the removable power supply is designed to convert a AC current into a DC current). In these examples, the removable power supply may shut itself off. As another example, the removable power supply may also report that there is a mismatch between the removable power supply and the removable power inlet. For example, the removable power supply may send a reporting signal to the computing device that there is a mismatch and/or indicate a mismatch via use of a light emitting diode (LED) on the outside of the removable power supply that is visible to a user of the computing device.

All of the features disclosed in this specification (including any accompanying claims, abstract and drawings), and/or all of the elements of any method or process so disclosed, may be combined in any combination, except combinations where at least some of such features and/or elements are mutually exclusive.

What is claimed is:

1. A network device comprising:
   a removable power inlet;
   a removable power supply;
   an electrical connection between the removable power inlet and the removable power supply;
      wherein the removable power inlet sends a signal through the electrical connection to the removable power supply indicating an ampere rating of the removable power inlet; and
      wherein the removable power supply sets a current limit on a power supplied from the removable power supply based on the signal;
      wherein the signal is set to a high signal based on a determination that the removable power inlet unit has a 20 ampere rating.

2. The network device of claim 1, wherein the network device provides the power supplied from the removable power supply via power over Ethernet.

3. The network device of claim 1, wherein the removable power inlet comprises a removable DC inlet.

4. The network device of claim 1, wherein the removable power inlet comprises a removable AC inlet.

5. The network device of claim 1, wherein the signal is set to low signal based on a determination that the removable power inlet unit has a 15 ampere rating.

6. The network device of claim 1, wherein the removable power supply comprises an over current protection circuit.

7. The network device of claim 6, wherein the over current protection circuit sets a current threshold on the power supplied from the removable power supply based on the signal and shuts down the removable power supply based on a determination that the current supplied exceeds the current threshold.

8. The network device of claim 6, wherein the current protection circuit sets a current threshold based on the signal.

9. A computing device comprising:
   a removable power inlet;

a removable power supply electrically connected to the removable power inlet unit;
  wherein the removable power inlet comprises an ampere current rating and sends a signal to the removable power supply indicating the ampere current rating;
  wherein the removable power supply sets a current limit on a power supplied from the removable power supply based on the signal; and
  wherein the computing device supplies the power supplied from the removable power supply using power over Ethernet;
  wherein the signal is set to a high signal based on a determination that the removable power inlet unit has a 20 ampere rating.

10. The computing device of claim 9, wherein the removable power supply is electrically connected to the removable power inlet unit by four conductors.

11. The computing device of claim 9, wherein the removable power inlet is removable from the computing device separately from the removable power supply.

12. The computing device of claim 9, wherein the signal indicates a type of current drawn by the removable power inlet.

13. The computing device of claim 9, wherein the signal is a binary signal.

14. The computing device of claim 9, wherein the removable power supply comprises an over current protection circuit to set a current threshold based on the signal.

15. A network device comprising:
a removable power inlet;
a removable power supply electrically connected to the removable power inlet unit, wherein the removable power supply comprises an over current protection;
  wherein the removable power inlet comprises an ampere current rating and send a signal to the removable power supply indicating the ampere current rating;
  wherein the removable power supply sets a current limit based on a power supplied from the removable power supply based on the signal; and
  wherein the over current protection sets a current threshold based on the power supplied from the removable power supply based on the signal.

16. The network device of claim 15, wherein the removable power inlet is removable from the networking device separately from the removable power supply.

17. The network device of claim 15, wherein the signal indicates a type of current drawn by the removable power inlet.

18. The network device of claim 15, wherein the network device provides the power supplied from the removable power supply by power over Ethernet.

19. The network device of claim 15, wherein the removable power supply is electrically connected to the removable power inlet unit by four conductors.

* * * * *